United States Patent [19]

Ulbrich

[11] Patent Number: 5,592,123

[45] Date of Patent: Jan. 7, 1997

[54] FREQUENCY STABILITY BOOTSTRAPPED CURRENT MIRROR

[75] Inventor: Stephen F. Ulbrich, Anaheim Hills, Calif.

[73] Assignee: Linfinity Microelectronics, Inc., Garden Grove, Calif.

[21] Appl. No.: 399,738

[22] Filed: Mar. 7, 1995

[51] Int. Cl.$^6$ ........................................ H03F 3/04
[52] U.S. Cl. ..................... 330/288; 323/313; 323/316; 330/257; 330/156
[58] Field of Search ............................. 330/156, 257, 330/288; 323/313, 315, 316

[56] References Cited

U.S. PATENT DOCUMENTS

| | | | |
|---|---|---|---|
| 4,366,445 | 12/1982 | Cave et al. ........................... | 330/257 |
| 4,525,663 | 6/1985 | Henry ................................... | 323/315 X |
| 4,792,745 | 12/1988 | Dobkin . | |
| 4,831,283 | 5/1989 | Newton . | |
| 4,920,339 | 4/1990 | Friend et al. . | |
| 5,029,284 | 7/1991 | Feldbaumer et al. . | |
| 5,099,137 | 3/1992 | Lattin, Jr. . | |
| 5,120,909 | 6/1992 | Kutz et al. . | |
| 5,130,635 | 7/1992 | Kase ....................................... | 323/280 |
| 5,213,846 | 5/1993 | Lee . | |
| 5,239,559 | 8/1993 | Brach et al. . | |
| 5,239,658 | 8/1993 | Yamamuro et al. . | |
| 5,254,883 | 10/1993 | Horowitz et al. . | |
| 5,272,396 | 12/1993 | Mammano et al. . | |
| 5,297,067 | 3/1994 | Blackborow et al. . | |
| 5,309,569 | 5/1994 | Warchol . | |
| 5,313,105 | 5/1994 | Samela et al. . | |
| 5,313,595 | 5/1994 | Lewis et al. . | |
| 5,319,755 | 6/1994 | Farmwald et al. . | |
| 5,336,948 | 8/1994 | Jordan . | |
| 5,338,979 | 8/1994 | Mammano et al. . | |
| 5,381,034 | 1/1995 | Thrower et al. . | |
| 5,398,326 | 3/1995 | Lee . | |

OTHER PUBLICATIONS

Glaser and Subak-Sharpe, Integrated Circuit Engineering—Design, Fabrication, and Applications, c. 1977 Bell Telephone Laboratories.

Brokaw, A. Simple Three Terminal IC Bandgap Reference, presented at International Solid-State circuits conference, Philadelphia, PA, Feb. 1974.

Baginski, Brokaw, Wurcer, D/A Converters and Filters, Session 12 of the 1990 IEEE International Solid-State Circuits Conference.

Linfinity Microelectronics, Production Data Sheet LX6431/LX6431A/LX6431B, Precision Programmable References Rev. 1.0, Oct. 1994.

Linfinity Microelectronics, Production Data Sheet TL431/TL431A/TL1431, Precision Programmable References Rev. 1.0, Jan. 1995.

Primary Examiner—James B. Mullins
Attorney, Agent, or Firm—Loeb & Loeb

[57] ABSTRACT

A floating current mirror circuit is disclosed which achieves high open loop gain without additional voltage gain stages leading to frequency compensation and increased power dissipation. The output of the circuit has only a first pole and is designed to be coupled to a second current source, a base coupled to the first terminal of the diode, and an emitter coupled to the floating node. A second bipolar transistor has a base coupled to the collector of the first transistor, and emitter coupled to the floating node.

15 Claims, 3 Drawing Sheets

FREQUENCY STABILITY BOOTSTRAPPED CURRENT MIRROR

BACKGROUND OF THE INVENTION

1. Field of the Invention

This invention relates generally to floating current mirror circuits, particularly those suitable for manufacturing in bipolar or BiCMOS integrated circuits. More particularly, this invention relates to floating current mirror circuits designed for high impedance output loads.

2. Description of the Prior Art

Current mirrors are typically used in operational amplifier circuit design to repeat currents ratioed to a first referenced current to one or more other locations. This allows the design to use a single reference current to generate additional different currents referenced to each other throughout a circuit as needed.

The basic structure of a current mirror is a diode or diode coupled transistor coupled across the base emitter junction of additional transistors. If the betas of the transistors are sufficiently large, the current through the additional transistors will be substantially proportional to the collector current of the diode coupled transistor by some factor.

In some configurations, the emitter terminals of the transistors and the diode coupled transistor are coupled to a common node. In using this configuration for current sources in integrated circuit designs, it is common to have more than one transistor having a base coupled to the base of the diode coupled transistor and an emitter coupled to the other emitters at the common node. In this fashion the magnitude of the current can be increased by a multiple of the number of additional collectors, or by the ratio of the emitter areas. Alternatively, emitter degeneration resistors may be used so that the current out of the mirror cell is less than the referenced current.

A floating mirror circuit refers to a mirror circuit where the emitters are coupled not to a ground but to a node at a different potential or to a node coupled to the ground by a current source. Examples of such include the floating current mirror circuit disclosed in U.S. Pat. No. 4,366,445 to Cave. This patent discloses a mirror circuit using all NPN transistors to overcome undesirable limited frequency responses of similar circuits employing PNP differential input transistors.

Another example of a floating current mirror includes the LM108 Super Beta Operational Amplifier in the National Data Book which discloses a three transistor mirror circuit with a diode coupled transistor coupled with a current source at the collector and base, and an emitter coupled to a floating node. A second transistor has a collector terminal coupled to a current source, a base coupled to the base and collector of the diode coupled transistor, and an emitter coupled to the floating node. A third transistor has a base terminal coupled to the collector terminal of the second transistor and an emitter coupled to the floating node. The output of this mirror circuit is at the floating node which feeds into the base terminal of a pass element.

An implementation of a floating current mirror circuit is shown in FIG. 1, where a diode coupled transistor 8 is diode coupled having the base and collector are coupled together is shown. The base of transistor 10 is coupled to the base and collector of transistor 8 and the collectors of transistors 8 and 10 are coupled to the current sources 2 and 4 respectively. The base of transistor 12 is coupled to the collector of transistor 10 and the collector of transistor 12 is coupled along with current sources 2 and 4 to a potential such as $V_{cc}$ at a node 14. The emitters of transistors 8, 10 and 12 are coupled together at a floating node 16 where an output voltage may be taken if the current sources 2 and 4 are, for example, differentially driven by a previous stage. However, this is not necessary. The node 14 is floating because it is coupled above ground at a node 18 by a current source 6. Alternatively, node 16 can be biased above ground by a potential (not shown).

The output of the circuit may be taken at the floating node 16 when a load having an impedance or capacitance is coupled thereto (not shown). However, the output of the floating mirror of the prior art at the floating node has a substantially lower output impedance than high impedance loads such as operational amplifiers and field effect transistors. Loading the prior art voltage output at the floating node requires the insertion of a voltage buffer to match the impedances of the output at the floating node and the input of the load. Inserting a voltage buffer at the floating node may add a capacitance that results in an addition of a pole to the circuit. The additional pole causes frequency instability at the output that can result in undesirable oscillations or decreased circuit performance at higher frequencies. Furthermore, the addition of a voltage buffer contributes to power dissipation resulting from the additional impedance inserted into the circuit and may also add noise.

Additionally, there are problems with inserting a floating mirror cell, such as that shown in FIG. 1, into a chip due to insufficient head room to accommodate the cell in low voltage power supply circuits such as 3.3 volt DC circuits. If $V_{cc}$ is only 3.3 volts above ground, then the floating node 16 must be at least one $V^{BE}+V_{SAT}$ below $V_{cc}$, so at most, the permissible output excursion for the node 16 is about 2.3 volts. Therefore, there are a number of drawbacks in the prior art.

SUMMARY OF THE INVENTION

An object of the invention is to provide a floating current mirror circuit for use in monolithic integrated circuits.

A further object of the invention is to achieve high gain while minimizing the number of additional stages that may alter the frequency response of the circuit and increase power dissipation.

Another object of the invention is to provide a floating current mirror having sufficient head room so that the floating current mirror may be used in an integrated circuit in a low voltage application.

Another object of the invention is to enhance stability of the output of a current mirror circuit by eliminating the pole added by the capacitive load as in the prior art.

Briefly, the invention is directed to a floating current mirror circuit having preferably only a first pole and designed to be coupled to a load having a high impedance such as greater than about ten meg ohms. The circuit comprises a diode coupled transistor having a first terminal coupled to a first current source and a second terminal coupled to a floating node. A second bipolar transistor has a collector coupled to a second current source, a base coupled to the first terminal of the diode coupled transistor, and an emitter coupled to the floating node. A third bipolar transistor has a base coupled to the collector of the second transistor, and an emitter coupled to the floating node.

The third bipolar transistor bootstraps the bipolar mirror and the input current sources to the floating node to improve DC characteristics by increasing the effective output resistance. The output of the circuit is located at the base of the third transistor or the collector of the second transistor resulting in a high small signal resistance at the output. Further, the capacitive load coupled to the output may affect the frequency and the magnitude of the first pole but does not create a second pole as a load does in the prior art.

Taking the output voltage from the base of the bootstrap transistor has a number of advantages. The floating node is removed from the direct signal path so that a second pole is not created and impedance mismatching is avoided when high impedance loads are used. Further, taking the output from the base of the bootstrap transistor, the highest permissible voltage excursion output is one $V_{BE}$ greater than in the prior art so that the circuit may more readily be used in low voltage circuits.

BRIEF DESCRIPTION OF THE DRAWINGS

The invention may be understood by reference to the accompanying drawings, of which.

DETAILED DESCRIPTION OF THE DRAWINGS

Figure 2:
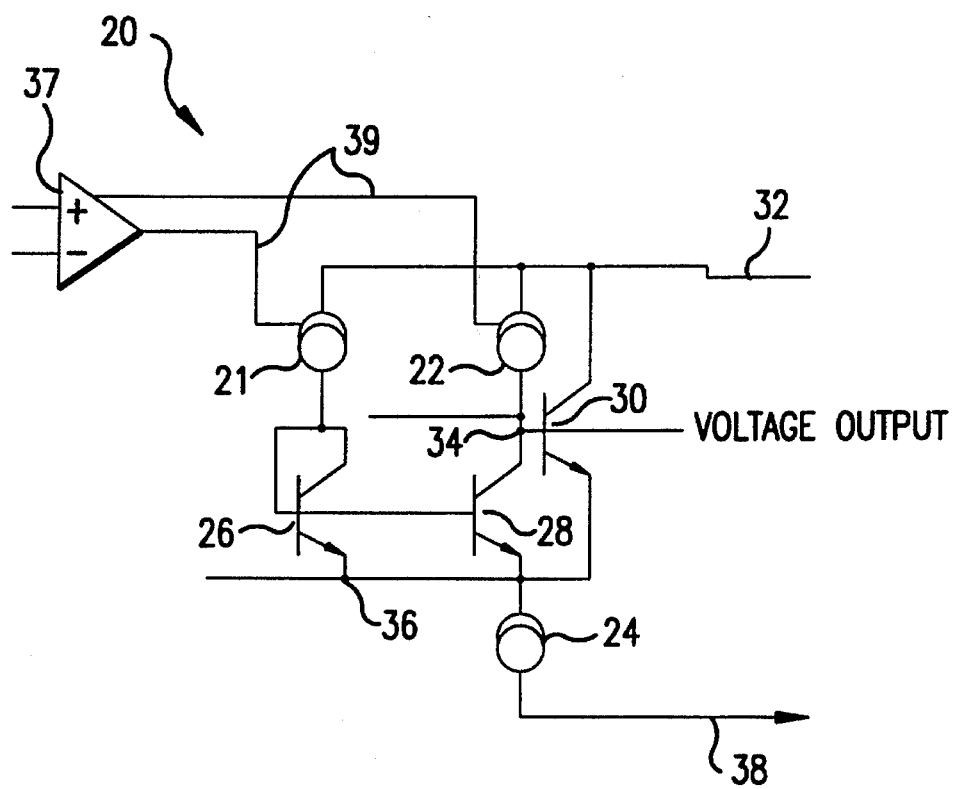
FIG. 2 is directed to an embodiment of the invention showing a current mirror circuit with the output at the collector of the first stage transistor or the base of the second stage transistor.

Turning to an embodiment 20 of the present invention in FIG. 2, a diode coupled transistor 26 has the base and collector coupled together. The base of transistor 28 is coupled to the base and collector of transistor 26 and the collectors of transistors 26 and 28 are coupled to the current sources 21 and 22 respectively. The base of transistor 30 is coupled to the collector of transistor 28, and the collector of transistor 30 is coupled to node 32 with current sources 21 and 22. The emitters of transistors 26, 28 and 30 are all coupled to a floating node 36 which is coupled to current source 24 so that the node 36 floats above ground. Alternatively, node 36 may be coupled to ground by a voltage source. The output of the circuit in FIG. 2 is taken from node 34 which is coupled to the base of transistor 20 and the collector of transistor 28.

If a differential input 39 is applied from a differential amplifier 37, transistor 30 bootstraps the bipolar mirror formed by transistors 26 and 28 and current sources 21 and 22 to floating node 36, thereby increasing the effective resistance at the output node 34. Changes in the current at current source 21 are mirrored to the collector current of transistor 28, which will be equal and opposite to the current change at current source 22 due to the differential control. As changes in the current at current source 21 occur, changes in the voltage at node 34 occur. However, no net current flows from output node 34 due to such changes. Since small signal resistance at node 34 is $\Delta V/\Delta I$, the small signal resistance at node 34 is effectively infinite since $\Delta I$ is approximately zero.

Since the small signal resistance at node 34 is very high and node 34 is the frequency compensation node (as standard practice dictates that the dominant pole compensation is to the node having the dominant resistance), the voltage output signal at node 34 can be the input signal node to a high DC input impedance buffer, an operational amplifier or any other device having a high input impedance. The high impedance of the output at node 34 may be matched with operational amplifiers, field effect transistors and voltage buffers.

Additionally, taking the output from the collector of transistor 28 or the base of transistor 30 avoids a voltage drop between the collector and the emitter of transistor 28 or between the base and emitter of transistor 30. This permits the maximum output excursion to be about one $V_{BE}$ higher, which is an important design consideration in low voltage circuitry.

Figure 1:
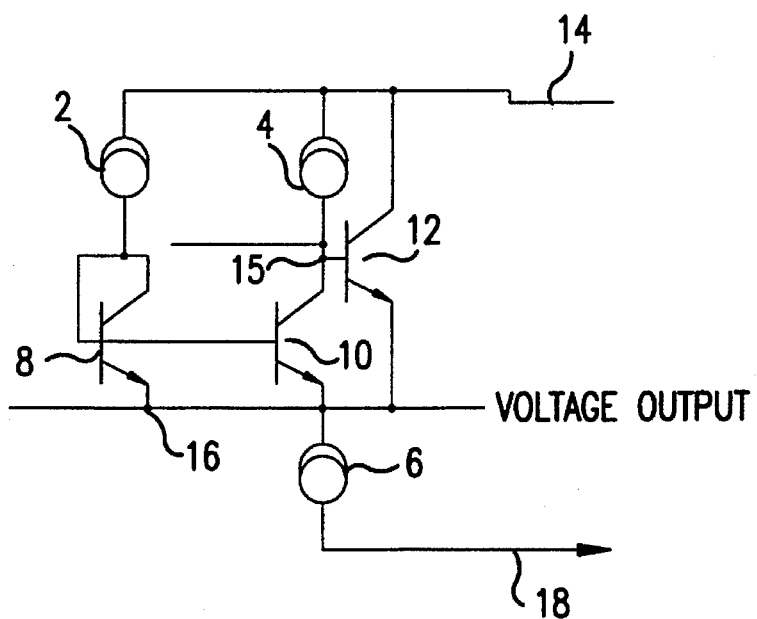
FIG. 1 is directed to a floating current mirror circuit in the prior art with the voltage output at the floating node.

A further advantage resulting from the disclosed structure is that a FET can be coupled as the load to the floating current mirror cell. In prior art circuits such as FIG. 1, the current source 4 should have a voltage drop of about 0.3 V while a FET (not shown) connecting between node 14 and the output 16 would force the drop between the output and $V_{cc}$ 14 to be about 0.3–0.5 V due to the FET's threshold voltage. This would mean that a transistor (not shown) acting as the current source 22 could not operate as a current source and would instead saturate. By taking the output at the base of the bootstrapping transistor 30 in FIG. 2, however, the threshold voltage of the FET (not shown) does not constrain the voltage across the current source to be less than is needed for the current source 22 to operate properly. Therefore, this shift in the level of the output is necessary for a FET to be the load of the circuit.

In another embodiment (not shown), the bootstrap transistor is replaced with an n-channel CMOS transistor. In reference to FIG. 2, that would involve replacing transistor 30 with an n-channel CMOS transistor (not shown) having a gate coupled to the collector of transistor 28, a drain coupled to node 32 and source coupled to floating node 36. The output is then taken from the collector of transistor 28 or the gate of the n-channel CMOS.

In another embodiment (not shown), the bipolar mirror portion of the circuit as shown in FIG. 2 is replaced with a CMOS mirror. Here, bipolar transistors 26 and 28 are replaced with CMOS transistors having gates coupled together. The CMOS transistor replacing bipolar transistor 26 has a gate coupled to a drain and current source 21, a drain coupled to current source 21, a source coupled to the floating node 36. The CMOS transistor replacing bipolar transistor 28 has a gate coupled to the gate and drain of the CMOS transistor replacing transistor 26, a drain coupled to current source 22 and the base of transistor 30, and a source coupled to the floating node 36. The output is taken from one of the base of transistor 30 or the drain of the CMOS transistor replacing bipolar transistor 28.

Also, emitter degeneration resistances can be used (not shown) to control the ratio of the reference current of the diode coupled transistor 26 to the mirrored current of transistor 28. In this embodiment, resistors are coupled between either of the emitters of transistors 26 or 28 and the floating node 36. The ratio of the currents is then determined by the betas of the transistors and the resistances coupled to the emitters.

Figure 3:
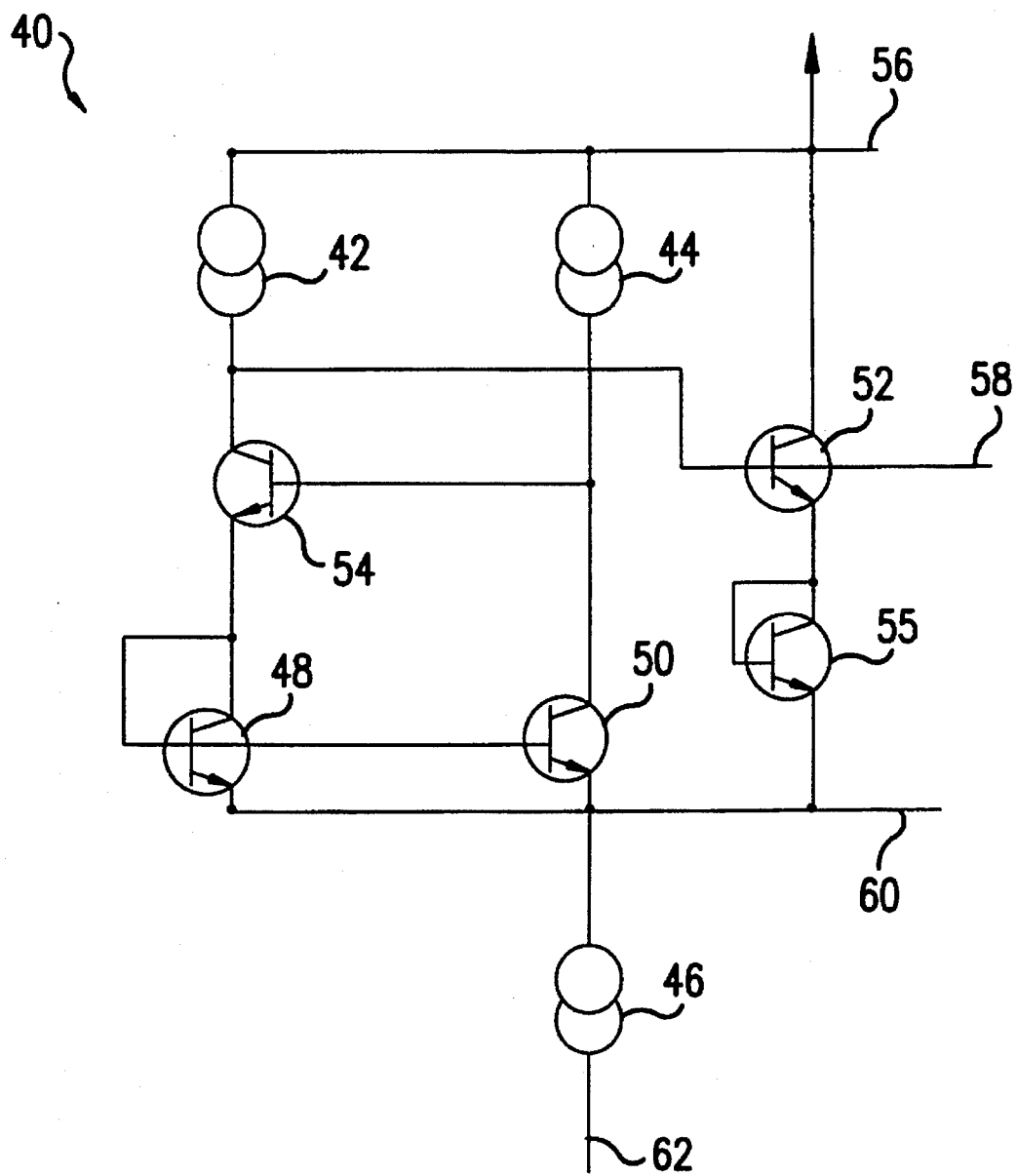
FIG. 3 is directed to an embodiment of the invention employing a Wilson technique to improve output impedance.

In other embodiments, the current mirror accuracy can be improved by employing Wilson or Fowler structures. In an embodiment employing a Wilson structure, the output impedance is increased with the addition of a bipolar transistor coupled between a current source and the diode coupled transistor. Referring to FIG. 3, the Wilson embodiment has a bipolar transistor 54 having a collector coupled with a current source 42, a base coupled to the collector of transistor 50 and the base of transistor 52, and an emitter coupled to the base and collector of diode coupled transistor 48. Additionally, the Wilson embodiment includes transistor 55 in series with transistor 52. Transistor 55 is diode coupled to prevent the current sources 42 and 44 and other transistors from operating in saturation.

Alternatively, the circuit of FIG. 2 can be modified by the inclusion of a beta helper transistor, resulting in what is sometimes called a Fowler structure. In such a circuit, diode coupled transistor 25 is no longer diode coupled. Instead, a beta helper transistor (not shown) having the base coupled to the collector of transistor 25 and the emitter coupled to the junction of the bases of transistors 25 and 28 is provided. In addition, the collector of the beta helper transistor (not shown) is coupled to the node 32.

Figure 4:
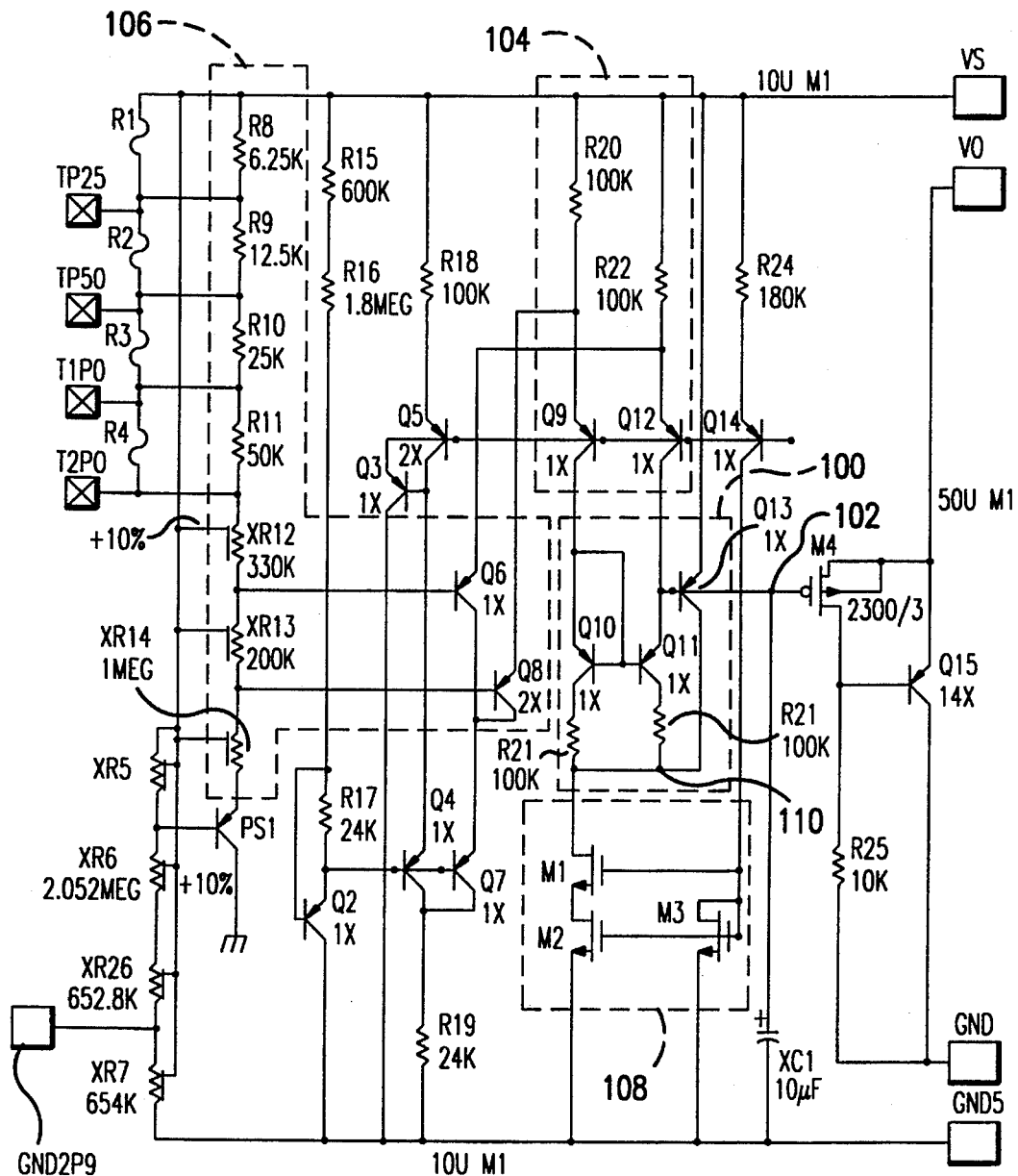
FIG. 4 is directed to a further embodiment of the invention which shows a two terminal bandgap voltage reference.

FIG. 4 shows a BiCMOS embodiment of the present invention in a two terminal bandgap voltage reference. Floating current mirror cell 100 provides an output at node 102 where a high impedance element, namely PMOS transistor M4, is the pass element. The output impedance of the floating mirror cell 100 at node 102 is substantially matched to the input impedance of the load transistor M4 as the small signal resistance at node 102 is substantially infinite. Current source 108 supplies a current to the current mirror cell 100 a floating node 110. Current sources 104 supply current to the current mirror 100 at the collectors of transistors Q10 and Q11. Differential amplifier 106 modulates the current differentially from the current sources 104 at the emitters of PNP transistors Q9 and Q12 so that the single ended voltage at the cell output 102 is a voltage based upon the voltage across resistor XR13.

Transistor Q10 is a diode coupled transistor having a base and a collector coupled to current sources 104 and to the base of transistor Q11, thereby forming the floating current mirror cell 100. The emitters of Q10 and Q11 are coupled to the floating node 110 through matched emitter degeneration resistors R21 and R23. Transistor Q11 has a collector coupled with current sources and to output node 102. Transistor Q13 has a base coupled to the collector of transistor Q11, an emitter coupled to the floating node 110, and a collector coupled to voltage source VS thereby bootstrapping the current sources 104 and the bipolar mirror formed by transistors Q10 and Q11 to the floating node 110.

A differential amplifier 106 formed by transistors Q6 and Q8 generates a bandgap voltage. The differential amplifier is formed by coupling a voltage differential to the base terminals of transistors Q6 and Q8. The voltage differential is generated by coupling voltage source VS through a voltage divider formed by XR12, XR13 and XR14 in series with any series combination of R8, R9, R10 and R11 with the voltage difference taken across XR 13. The appropriate series combination of R8, R9, R10 and R11 is selected by opening any of the respective fuses R1, R2, R3 or R4 to add the corresponding resistor to the voltage divider during wafer-probe.

The differential amplifier 106 alters the current from the current sources 104 formed by PNP transistors Q9 and Q12 by bleeding off currents from sources 104 differentially based upon the bases of transistors Q6 and Q8. The emitters of Q9 and Q12 are coupled to voltage source VS through the matched resistors R20 and R22 such that with a voltage difference is applied at the emitters, a differential between the collector currents of Q9 and Q12 provides a drive signal during start up.

NMOS transistors M1 and M2 coupled in series form the current source 108 to the floating node 110 by a reference current through NMOS transistor M3 in a mirrored relationship with NMOS transistors M1 and M2. The gates of NMOS transistors M1 and M2 are coupled to the gate and drain of NMOS transistor M3 and the collector of PNP transistor Q14. NMOS transistors M1 and M2 are coupled together in series and to the floating node 110 of the current mirror 100 through matched resistors R21 and R23 at the drain of NMOS transistor M1, and to source ground GNDS at the source of NMOS transistor M2. NMOS transistors M1 and M2 are powered by a voltage supplied to the respective gates by the collector of PNP transistor Q14 and a current supplied to the source from the drain of NMOS transistor M2.

The load CMOS transistor M4 provides a DC regulated power supply. CMOS transistor M4 provides a drive current to terminal VO in response to the preceding circuitry which regulates the voltage at the output 102. The DC gain of CMOS transistor M4 is substantially unity.

The embodiments disclosed in this description provide an improved floating current mirror circuit for supplying voltage at an output having only a first pole and designed to be coupled to high impedance loads without the addition of buffers. As shown in FIG. 2, having the output terminal at the base of a bipolar transistor 30 or the collector of bipolar transistor 28 substantially increases output impedance. Hence, coupling high input impedance of devices such as field effect transistors, operational amplifiers or buffers to the output does not require inserting a voltage buffer to match the output impedance of the current mirror cell with the input impedance of the load. Consequently, these embodiments avoid a second pole that can cause frequency instability from the capacitance of a buffer. Furthermore, avoiding a diode drop across transistor 30 provides more headroom to insert the floating mirror into low voltage power supply circuits such as 3.3 volt DC circuits.

What is claimed is:

1. A floating current mirror cell having only a first pole the floating current mirror cell comprising:

a capacitive load;

a floating node;

a current source;

a current mirror coupled to a reference current and the floating node and responsive to the current source, the current mirror having a first transistor having a control node, a pair of ports through which current flow is controlled by the control node the transistor being coupled to provide a current proportional to the reference current at a first of the ports;

a second transistor having a control node, and a pair of ports through which current flow is controlled by the control node, a first of the ports of the second transistor being coupled to the floating node and the control node of the second transistor being coupled to the first port of the first transistor;

wherein one of the control node of the second transistor and the first port of the first transistor being the output of the cell such that the capacitive load coupled to the output of the cell affects the frequency and the magnitude of the first pole.

2. The floating current mirror cell of claim 1, wherein the capacitive load coupled to the output comprises a field effect transistor.

3. The floating mirror cell of claim 1, wherein the capacitive load coupled to the output comprises an operational amplifier.

4. The floating mirror cell of claim 1, wherein the capacitive load coupled to the output comprises a buffer.

5. The floating current mirror cell of claim 1, the cell further comprising a differential amplifier having a differential output coupled to the reference current and the current source so that changes in the reference current are substantially equal and opposite to changes in the current of the current source, wherein a second of the ports of the second transistor is coupled to the first and second current sources thereby bootstrapping the mirror cell of said circuit with said current source so that there are no substantial changes in current flowing from the output with changes in the voltage at the output.

6. A floating current mirror cell having only a first pole the floating current mirror cell comprising:

a load having an impedance of greater than about ten megohms;

a floating node;

first and second current sources;

a diode having two terminals, a first of the terminals being coupled to the first current source and the second terminal being coupled to the floating node;

a first transistor having a control electrode, an input and output, port, the control electrode being coupled to the first terminal of the diode, the input port being coupled to the floating node and the output port of the first transistor being coupled to the second current source;

a second transistor having a control electrode and input and output ports, the input port of the second transistor being coupled to the floating node and the control electrode of the second transistor being coupled to the output port of the first transistor, one of the control electrode of the second transistor and the output port of the first transistor being the output of the cell such that an impedance at the output of the cell substantially matches the impedance of the load.

7. The floating current mirror cell of claim 6, wherein the impedance of the load coupled to the output comprises a field effect transistor (FET) having a gate, a drain and a source, the gate being coupled to the output and the source of the FET being coupled to the load.

8. The floating current mirror cell of claim 6, wherein the high impedance load coupled to the output comprises an operational amplifier.

9. The floating current mirror cell of claim 6, wherein the high impedance load coupled to the output comprises a buffer.

10. The floating current mirror cell of claim 6, the cell further comprising a differential amplifier having a differential output coupled to the first and second current sources so that changes in the current of the first current source are substantially equal and opposite to changes in the current of the second current source, wherein the output port of the second transistor is coupled to the first and second current sources thereby bootstrapping the bipolar mirror portion of said circuit with said first and second current sources so that there are no substantial changes in current flowing from the output with changes in the voltage at the output.

11. In a low voltage regulator to provide an output voltage of less than about 3.5 volts, the low voltage regulator having an amplifier having an active device having a load between two electrodes, a biasing voltage comprising one of a source to gate threshold voltage and an emitter to base threshold voltage, and a control electrode comprising one of a base and a gate, wherein the improvement comprises:

a power supply of less than about 3.5 volts to power the regulator;

a floating node provided by a current source coupled between a reference voltage and the floating node such that the floating node floats irrespective of the current drawn by the load;

a second node at a predetermined voltage;

first and second current sources, the second current source including a first transistor coupled to the second node and the first transistor having a linear region, a saturated region and cutoff region of operation;

a diode having two terminals, a first of the terminals being coupled to the first current source and the second terminal being coupled to the floating node;

a second transistor having a control electrode controlling current flow between first and second electrodes the first electrode being coupled to the second source, the control electrode being coupled to the first terminal of the diode, and the second electrode being coupled to the floating node;

a third transistor having a control electrode controlling current flow between a third and a fourth electrode, the third electrode of the third transistor being coupled to the floating node and the control node of the third transistor being coupled to the first electrode of the second transistor;

wherein one of the control electrode of the third transistor and the first electrode of the second transistor being the output of the cell such that when the load of the active device is coupled between the second node and one of the control electrode of the third transistor and the first electrode of the second transistor, the second current source operates in one of the linear and saturated region and wherein a load transistor having a control electrode and first and second electrodes, the control electrode being coupled to the output of the cell to provide a regulated voltage.

12. The floating current mirror cell of claim 11, the cell further comprising a differential amplifier having a differential output coupled to the first and second current sources so that changes in the current of the first current source are substantially equal and opposite to changes in the current of the second current source, wherein the first electrode of the second transistor is coupled to the first and second current sources thereby bootstrapping the bipolar mirror cell of said circuit with said first and second current sources so that there are no substantial changes in current flowing from the output with changes in the voltage at the output.

13. A method for generating a voltage at a high impedance output terminal having only a first pole, the method comprising: coupling a reference current to a current mirror cell, the current mirror cell having:

a first bipolar transistor having a base, collector and emitter; and a second bipolar transistor having a base, collector and emitter, the emitter of the second bipolar transistor being coupled to a floating node, the base of the second bipolar transistor being coupled to the collector of the first bipolar transistor;

providing a source current to the current mirror cell at the collector of the first bipolar transistor so that the first bipolar transistor provides a current proportional to the reference current at the collector; and coupling to form an output node at one of the collector of the first bipolar transistor and the base of the second bipolar transistor a load having an impedance that substantially matches the impedance at one of the collector of the first bipolar transistor and the base of the second bipolar transistor with the net current flow at the output node being substantially zero.

14. A reference voltage generator generating a reference voltage to a load, the generator comprising:

a bandgap generator generating a bandgap voltage;

a differential amplifier amplifying the bandgap voltage to provide a differential outputs based upon the bandgap voltage;

a floating current mirror to convert the differential output into a single ended output, the floating current mirror comprising:

a diode having a current flowing between first and second terminals and generating a voltage across the terminals based upon a first of the differential outputs;

a first transistor having first, second and third terminals, with the first and second terminals coupled to the first and second terminals of the diode and biased by the voltage to conduct a current proportional to the current flowing through the diode;

one of a current source and a current sink coupled to the second terminal of the diode and the transistor to make the second terminal of the diode and transistor floating;

a second transistor having a first, second and third terminals, the first and second terminal being coupled across the second and third terminal of the first transistor; and an output MOSFET having a control electrode and a source, the source of the MOSFET being coupled to the load.

15. In a low voltage regulator to provide a regulated voltage with a supply voltage of less than about 3.5 volts, the low voltage regulator having an amplifier having an active device having a load between two electrodes, a bias voltage comprising one of a source to gate threshold and an emitter to base threshold voltage and a control electrode comprising one of a base and a gate, with a floating mirror wherein the improvement comprises:

the floating mirror including:

a floating node obtained by providing one of a current source and a current sink between the node and a reference voltage of a first conductivity type;

first and second current sources or current sinks;

a diode having two terminals a first of the terminals being coupled to the first of the current source or current sink and the second terminal being coupled to the floating node;

a first transistor having a control electrode regulating current flow between two electrodes, the control electrode being coupled so that the first transistor mirrors current flow between the two electrodes of the diode and has a first of the two other electrodes being coupled to the floating node;

a second transistor having a control electrode regulating current flow between two electrodes, the control electrode of the second transistor being coupled to the second of the other electrodes of the first transistor and a first of the other electrodes of the second transistor being coupled to the floating node; and a load comprised of a transistor of a second conductivity type coupled across the current mirror and the control electrode of the third transistor such that the current mirror remains a current mirror when the supply voltage is less than about 3.5 volts.

* * * * *